(12) United States Patent
Sauerwein et al.

(10) Patent No.: US 7,171,512 B2
(45) Date of Patent: Jan. 30, 2007

(54) HIGHLY PARALLEL DATA STORAGE CHIP DEVICE

(75) Inventors: Tracy Sauerwein, Boise, ID (US); John Craig Raese, Boise, ID (US); Richard Hilton, Boise, ID (US); Donald Fasen, Boise, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 365 days.

(21) Appl. No.: 10/848,392

(22) Filed: May 17, 2004

(65) Prior Publication Data
US 2005/0254278 A1 Nov. 17, 2005

(51) Int. Cl.
G06F 12/00 (2006.01)

(52) U.S. Cl. .................. 711/100; 711/168; 365/63

(58) Field of Classification Search .............. 711/100, 711/149, 150, 168; 365/63
See application file for complete search history.

(56) References Cited

U.S. PATENT DOCUMENTS

| | | |
|---|---|---|
| 4,584,616 A | 4/1986 | Allen |
| 5,838,108 A | 11/1998 | Daberko et al. |
| 5,872,673 A | 2/1999 | Purkett |
| 5,898,476 A | 4/1999 | Carr et al. |
| 6,134,236 A | 10/2000 | Nakatusugawa |

*Primary Examiner*—Hiep T. Nguyen

(57) ABSTRACT

A highly parallel data storage chip device providing a plurality of parallel data tracks allocated into separate physical groups upon a data storage medium. A controller establishes logical groups of data tracks located in different physical groups. A servo track provides tracking information for a plurality of read/write devices that move relative to the length of each data track, thereby permitting parallel data transfer between the read/write devices and the distributed data tracks of the logical group.

33 Claims, 5 Drawing Sheets

(Logical Layout)

US 7,171,512 B2

HIGHLY PARALLEL DATA STORAGE CHIP DEVICE

FIELD OF THE INVENTION

This invention relates generally to memory cards, and more particularly to a highly parallel data storage chip device.

BACKGROUND

Sophisticated computer systems and electronic devices are providing rapid growth in portable electronic devices. These devices typically require medium for the storing of information, such as a phase change polymer or magnetic material. Typically, these devices include some form of read and write mechanism for transferring data to and from the device.

Storage devices are conventionally larger in capacity and somewhat slower in response time than main memory devices. For example a hard drive may provide several gigabytes of storage with access times of about 6 milliseconds, whereas main memory RAM may provide a few hundred kilobytes with access times orders of magnitude faster than a hard drive.

With fast access main memory devices such as RAM, increasing the storage capacity generally also increases the complexity of the physical memory structure as well as the complexity of the control logic and interface mechanism. By utilizing a moving read/write device as opposed to hard wiring each and every data location, storage devices can provide large capacity while minimizing the required overhead support.

To write information, the storage device positions its write device relative to the location on the medium where the information is to be stored. The storage of information is commonly referred to as writing data. To read the information back, the device must position its read device relative to the location on the medium where the information was previously written. For both operations, proper tracking and alignment are required to insure that the proper data is transferred.

Traditionally, a single read/write device operates to read/write an entire stream of user data in series. For example the data "28088" is written in series to one data track. The user data is conventionally represented in appropriate machine readable code—most commonly symbolized as block patters of "1" and "0". The speed of the device is in part limited by the speed of the read write device and how fast it can, 1) move over the media or data track, and 2) transfer information to or from the medium or data track.

Storage devices such as memory cards are often intended for use in portable electronic devices such as cameras and MP3 players. As such, it is desirable for such storage devices to be as physically small as possible. Such a desire imposes manufacturing constraints as to the size of individual components. Portable devices are also often subjected to motion shock. To avoid damage to data, it is desirable for the memory device to be fabricated so as to tolerate the stress of motion shock.

Portable storage media devices often use one or more micromovers, i.e. tiny movement devices that impart relative movement between the read/write device and the data storage medium. The loss or damage of a read/write device or misalignment of the medium by the micromovers may result in corrupted data. Such loss or damage may occur as the result of motion, shock and or other factors. In an effort to increase the speed of data access, the micromovers may be operated at a high speed. High speed often compounds problems should a read/write device fail and contact the data storage media in an abnormal fashion.

Because data is written to a single location, such as a data track, by a single device, the entire stream of user data may be lost if the read/write device malfunctions. It is not uncommon for memory modules to occasionally suffer damage to the read/write device or the data tracks established in the media when subjected to motion shock and other environmental factors. In storage devices fabricated on a small scale for appropriate use in portable devices, the likelihood for manufacturing errors to occur and disable a read/write head or data media is certainly increased.

One frequently employed strategy to help reduce data corruption is the provision of a considerable amount of buffering data space between allocated data tracks. However, each allocation of buffering space reduces the space available for actual data storage. With a desire to provide maximum storage space, each allocation of buffer space is somewhat counter productive.

Hence, there is a need for an ultra-high density storage device that overcomes one or more of the drawbacks identified above.

SUMMARY

The present disclosure advances the art and overcomes problems articulated above by providing a highly parallel data storage chip device.

In particular, and by way of example only, according to one embodiment, this invention provides a highly parallel data storage chip device including: a data storage medium providing foundation for a plurality of parallel data tracks having the same length, each presenting a first and second end and a material for receiving data therebewteen, the plurality of data tracks allocated into separate physical groups; at least one servo track parallel to the data tracks and presenting tracking information for a logical group of data tracks selected from multiple physical groups; a plurality of read/write devices proximate to the data storage medium and aligned transverse to the servo track; a mover configured to provide relative horizontal motion between the plurality of read/write devices and the data storage medium; a controller capable of establishing the logical group corresponding to the servo track and operating the mover over a pathway including the servo track; the controller being operable during a data transfer operation to align a read/write device with a servo track and align a subset of read/write devices to the logical group of data tracks corresponding to the tracking information, the controller further directing simultaneous data transfer between the subset of read/write devices and the logical group of data tracks concurrent with relative motion.

DETAILED DESCRIPTION

Before proceeding with the detailed description, it is to be appreciated that the present teaching is by way of example, not limitation. The concepts herein are not limited to use or application with a specific type of data storage chip. Thus, the instrumentalities described herein are for the convenience of explanation, shown and described with respect to exemplary embodiments. It will be appreciated that the principles herein may be equally applied in other types of data storage chips.

Figure 1:
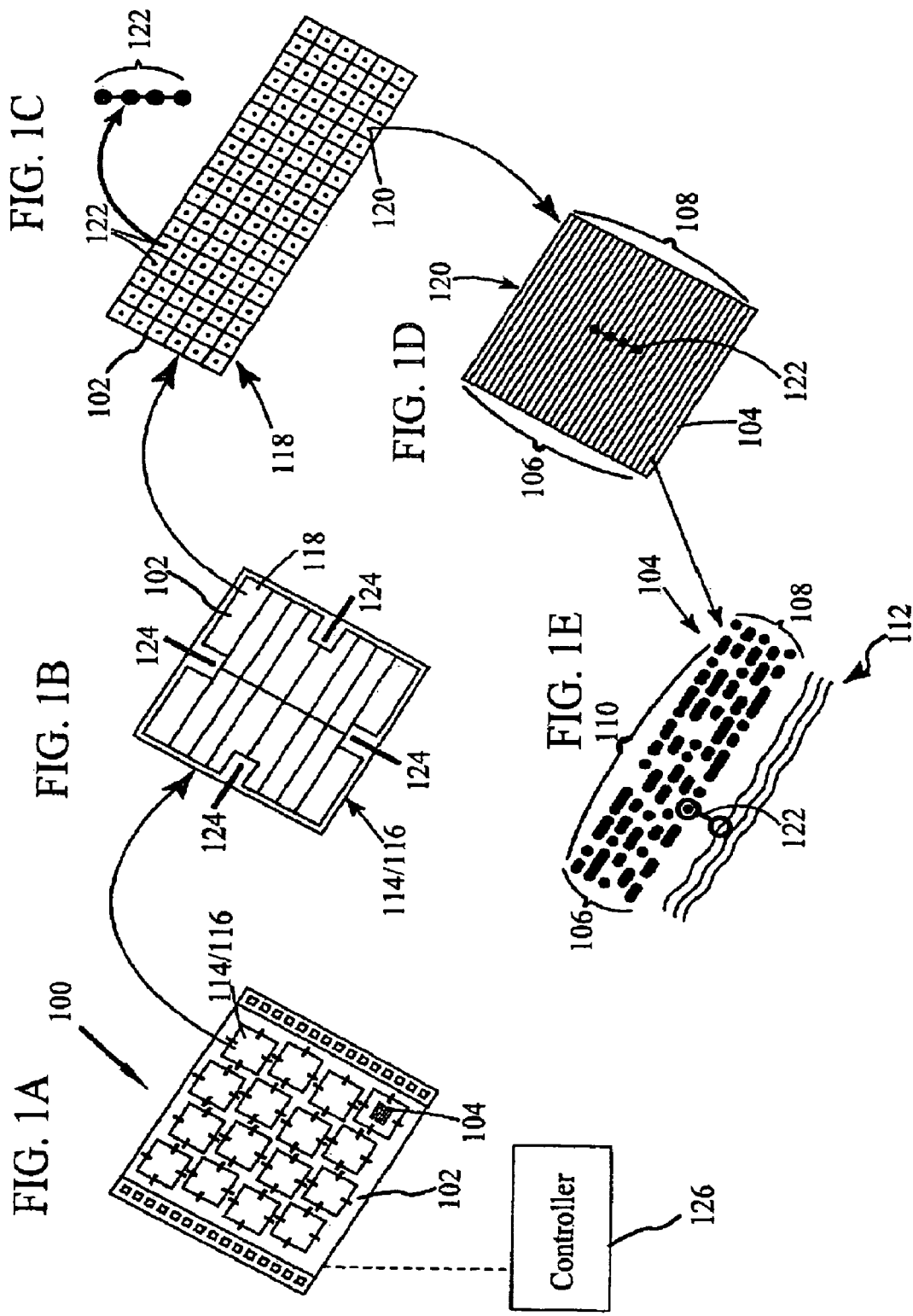
FIG. 1 shows a conceptual diagram illustrating an embodiment of the highly parallel data storage chip device.

Referring now to the drawings, and more particularly to FIG. 1A, there is shown a conceptual diagram illustrating an embodiment of the highly parallel data storage chip device 100. Highly parallel data storage chip device 100 includes a data storage medium 102 providing foundation for a plurality of parallel data tracks 104 having the same length.

The plurality of data tracks 104 are allocated into separate physical groups 114. As shown in conceptual embodiment of FIG. 1A there are sixteen physical groups 114, each providing a plurality of data tracks 104. In at least one embodiment, the physical groups 114 are subdivided into smaller physical groups as is conceptually shown in FIGS. 1B through 1E.

For example, in at least one embodiment the sub-grouping of each physical group is as follows. Each of the sixteen physical groups 114 in FIG. 1A may also be described as a platter 116. FIG. 1B is an enlargement of a single platter 116 shown in FIG. 1A. Each Platter 116 is subdivided into a plurality of clusters 118. FIG. 1C is an enlargement of a single cluster 118 shown in FIG. 1B. Each cluster 118 is subdivided into a plurality of patches 120. FIG. 1D is an enlargement of a single patch 120 shown in FIG. 1C. Each patch includes a plurality of data tracks 104.

FIG. 1E conceptually illustrates five data tracks 104 and three servo tracks 112. As may be more fully appreciated with respect to FIG. 1E, each data track 104 presents a first end 106 and a second end 108 and a material 110 for receiving data therebetween. In addition, at least one servo track 112 is provided parallel to the data tracks 104.

To summarize, in the embodiment suggested by FIGS. 1A through 1E, the highly parallel data storage chip device 100 includes sixteen platters 116, each platter 116 including sixteen clusters 118, each cluster 118 including one hundred eight patches 120, and each patch 120 including one thousand data tracks 104. Under appropriate circumstances, highly parallel data storage chip device 100 may include physical groups 114 including different hierarchies of ultimately providing parallel data tracks 104.

Figure 3:
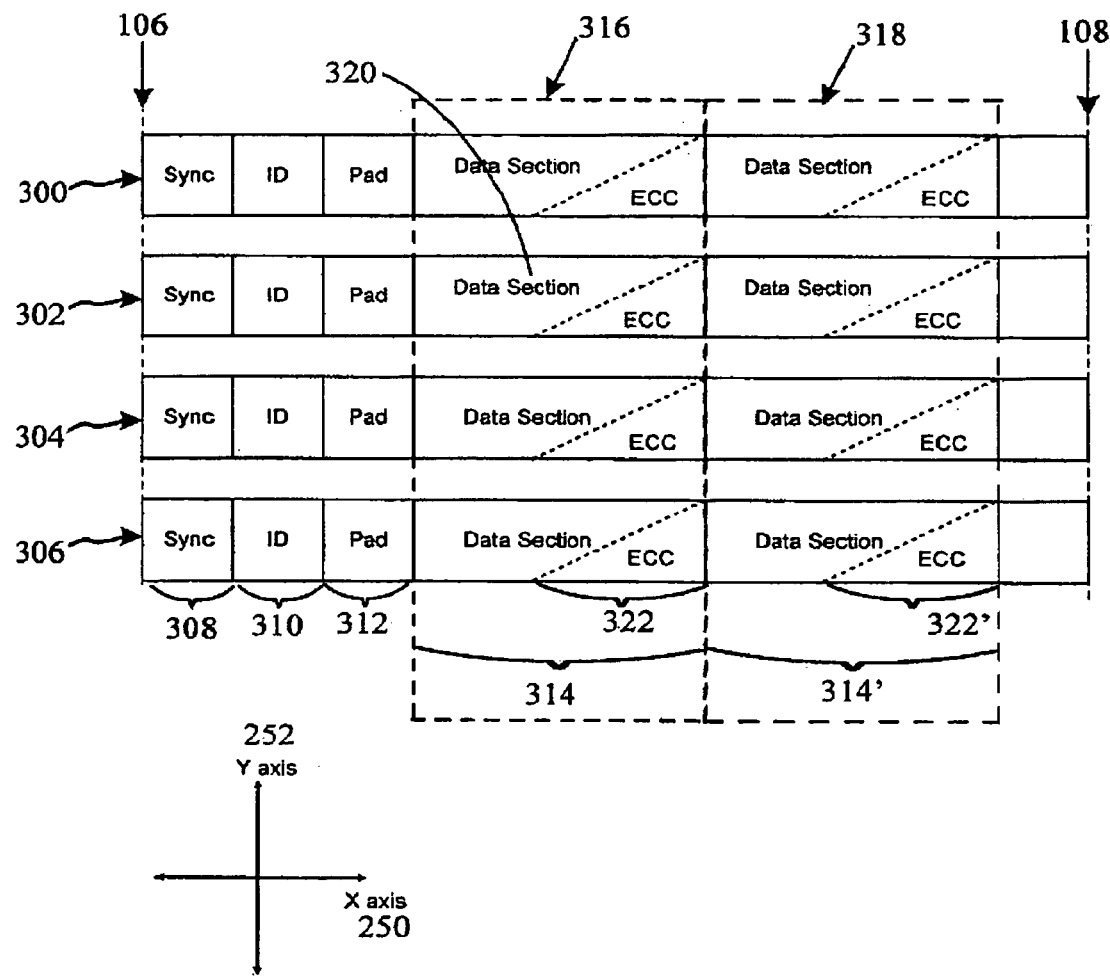
FIG. 3 illustrates the logical data track layout for an embodiment of the highly parallel data storage chip device.

Each servo track 112 presents tracking information for a logical group of data tracks 104 selected from different physical groups 114. As will become apparent in the following text, and as illustrated in FIG. 3, the data track members of a logical group are distributed among a plurality of physical groups 114. Generally, the servo tracks 112 are established as part of the highly parallel data storage chip device 100 fabrication process. The data tracks 104 may be established during fabrication or after fabrication. A plurality of read/write devices 122 (see FIGS. 1C and 1D) are provided proximate to the data storage medium 102 and aligned transverse to the servo track 112 as shown in FIG. 1E.

In an embodiment, the plurality of read/write devices 122 is presented in a fixed array incorporating uniform spacing between each read/write device 122. The read/write devices 122 presented are appropriate for the data storage medium 102. For example, where the data storage medium 102 provides ferromagnetic data tracks, the read/write devices 122 are appropriately ferromagnetic read/write heads such as a magneto-resistive heads or giant magneto-resistance heads. For non-ferromagnetic data tracks such as polymers utilizing "bumps" and "dips" to represent binary "0" and "1", the read/write device may be a cantilever tip contacting the polymer surface. For non-ferromagnetic data tracks such as in phase change materials, the read/write device may be an electron beam coupled with a sense diode.

Figure 5:
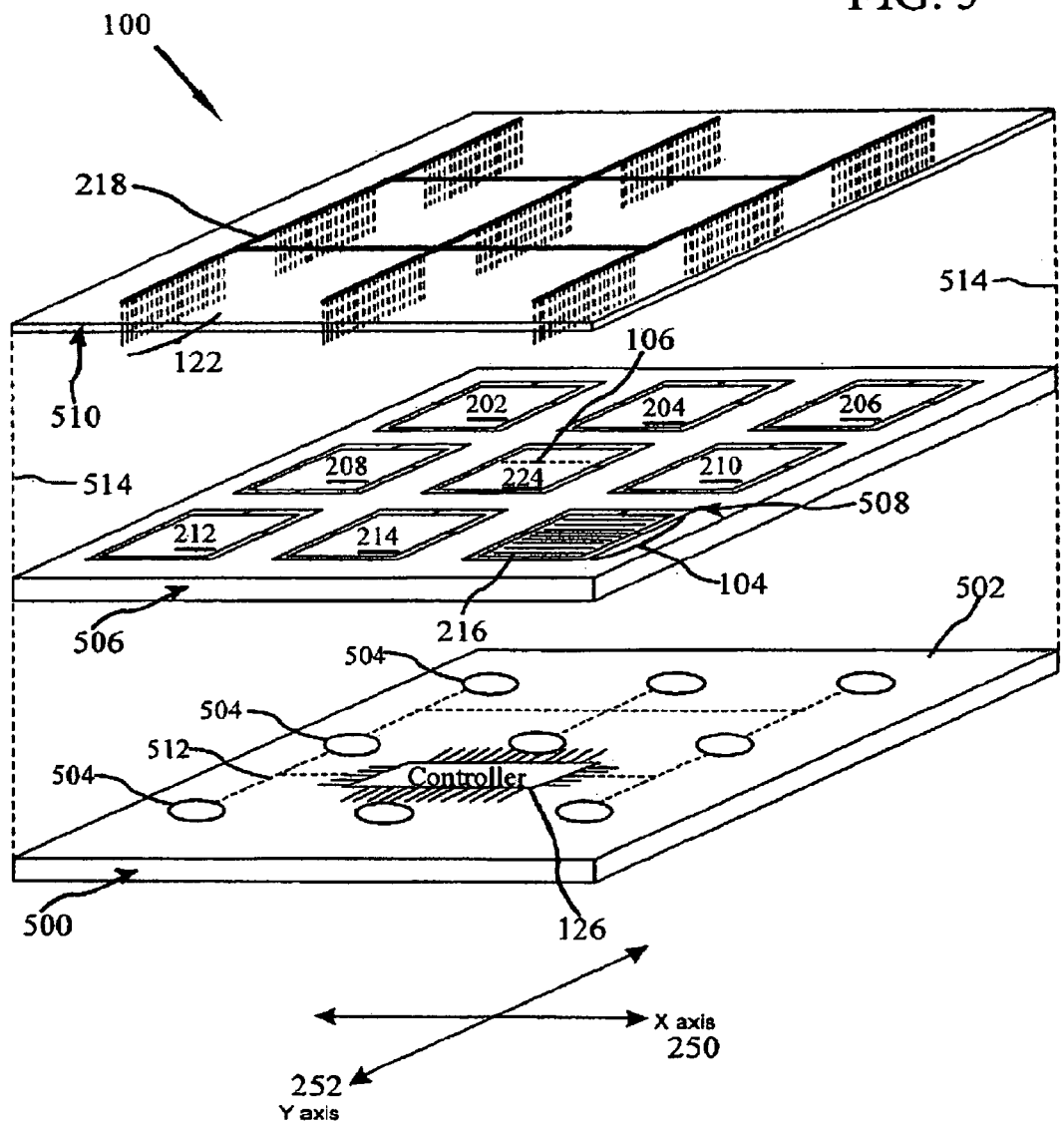
FIG. 5 illustrates a partial perspective of an embodiment of the highly parallel data storage chip device.

A plurality of movers are provided and configured to provide relative horizontal motion between the plurality of read/write devices 122 and the storage medium 102. As shown in FIGS. 1A and 1B, the mover may include four springs 124 that assist the micromovers 504 located below each moving portion 114, as shown in FIG. 5. For ease of discussion, with respect to FIGS. 1A and 1B movers and springs are interchangeably identified as items 124.

In at least one embodiment, the movers and four springs 124 are coupled to each platter 116 and configured to permit the relative location of the platter 116 to be changed or adjusted. The micromovers 504 (see FIG. 5) and springs 124 cause the platter 116 to move relative to the plurality of read/write devices 122. In at least one embodiment, each mover 124 is preferably an electrostatic motor. Under appropriate circumstances a step motor or other movement-imparting device may be employed.

A controller 126 capable of directing the operation of each mover 124 is also provided and is electrically coupled to highly parallel data storage chip device 100, and is further illustrated in FIG. 5. The controller 126 is also capable of directing the operation of the read/write devices 122. A suitable controller 126 may be comprised of analog circuitry, a digital processor, a CPU programmed with control logic, a device driver, and combinations thereof. Under appropriate circumstances, the controller 126, or portions of the controller 126, may be integrated with the mover 124.

The controller 126 establishes the logical groups of data tracks 104 through a method such as logical block addressing. As in the case of traditional logical block addressing, an algorithm provided to the controller 126 as microcode stored in a ROM, EPROM or another device, systematically subdivides the data sections 314 (discussed below and shown in FIG. 3) of each data track 104. As such, the logical block addressing provides a map as to where data blocks are stored within the highly parallel data storage chip device 100. In at least one embodiment, fifteen data tracks 104 comprise a logical group of data tracks identified by the controller 126.

In at least one embodiment, the plurality of data tracks 104 set upon the data storage medium 102 are established during fabrication of the highly parallel data storage chip device 100. In at least one alternative embodiment, the controller 126 is further capable of operating the mover 124 over a pathway parallel to the servo track 112 to define, by action of the plurality of read/write devices 122 on the data storage medium 102, the plurality of parallel data tracks 104.

In at least one embodiment, the data tracks 104 are configured to hold digital information represented in binary "1" and "0". The binary values may be represented as "bumps" and "dips", alternating magnetic fields, reflective and non-reflective areas, or other methods of storage. Each servo track 112 provides analog data, thus permitting use of a feedback system to adjust the alignment of the read write devices 122 to maintain the signal produced from the analog servo track at or above a pre-determined threshold. In further addition, as one servo track 112 may provide tracking information for a plurality of data tracks 104, the ratio of servo tracks 112 to data tracks 104 may be less than one to one.

Briefly stated, the controller 126 is capable of operating the mover 124 over a pathway including the servo track 112. During a data transfer operation, the controller 126 is operable to align a read/write device 122 with a servo track 112, and to align a subset of the read/write devices 122 to the logical group of data tracks 104 identified by the tracking information. The controller 126 further directs the simultaneous data transfer between the subset of read/write devices 122 and the logical group of data tracks 104 concurrent with the relative motion.

Figure 2:
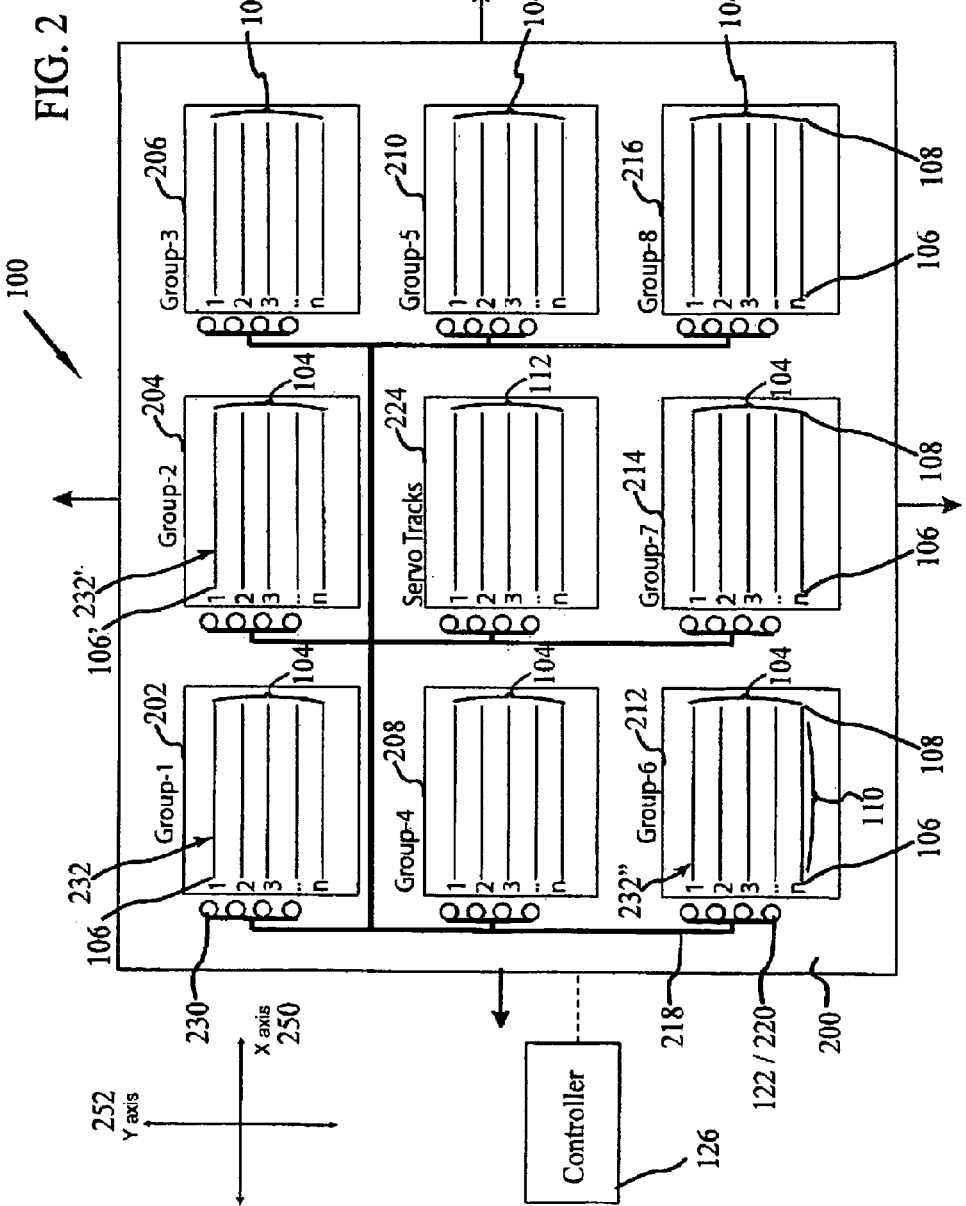
FIG. 2 shows a conceptual detail of a portion of an embodiment of the highly parallel data storage chip device.
Figure 4:
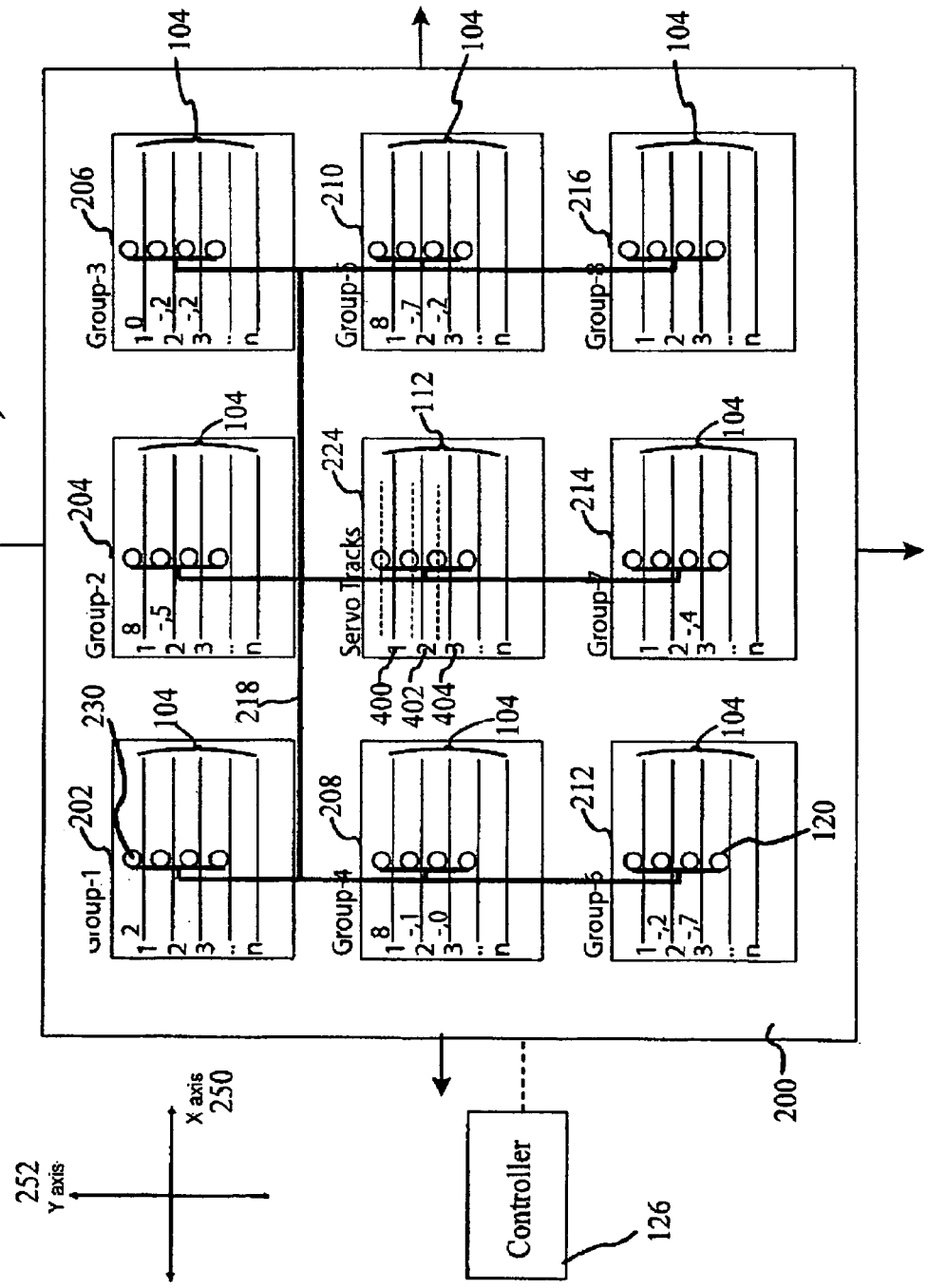
FIG. 4 shows a conceptual detail of a portion of an embodiment of the highly parallel data storage chip device containing user data.

The advantages of the highly parallel data storage chip device 100 with respect to the speed of data transfer, enhancements for data integrity as well as other benefits may be more fully appreciated with respect to FIGS. 2 through 4.

FIG. 2 presents a generalized conceptual illustration of a data medium 200 providing a plurality of parallel data tracks 104 allocated to separate physical groups 202~216. In at least one embodiment, each physical group 202~216 contains the same number of data tracks 104. For conceptual simplicity the hierarchal breakdown of the separate physical groups 202~216 into clusters 118 and patches 120, as suggested in FIGS. 1A through 1E, is not shown.

The data medium 200 may further be described as substantially existing in plane having an X axis 250 transverse to a Y axis 252. The plurality of data tracks 104 are arranged substantially parallel to the X axis 250.

The plurality of read/write devices 122 illustrated in FIGS. 1A~1E, is now represented in FIG. 2 as structured read/write frame 218 with a plurality of grouped circles 220. Each circle 220 represents an actual read/write device 122, such as for example a magnetic read/write head. The alignment of the read/write devices 122 upon the frame is transverse to the parallel data tracks 104. Moreover, with respect to the X axis 250 and Y axis 252, the alignment of the read/write devices 220 is substantially parallel to the Y axis 252.

Subsets of read/write devices 220 presented by the structured read/write frame 218 are aligned with each physical group 202~216. As suggested in the illustration, the number of read/write devices 220 presented to each physical group 202~216 may be less than the number of data tracks 104 allocated within each physical group 202~216.

In FIG. 2, the structured read/write frame 218 is shown providing the read/write devices 220 to the left of each physical group 202~216, for ease of illustration. The relative at rest position may align the read/write devices 220 to the right, left, center, or other position relative to each physical group 202~216.

Relative movement of one read/write device 220 with respect to one data track 232 results in symmetric relative movement of the remaining read/write devices 122 with respect to other data tracks 232'. In at least one embodiment, the number of read/write devices 122 is equal to or less than the number of data tracks 104 plus the servo tracks 112.

Within each physical group 202~216, the parallel data tracks 104 are uniformly aligned. More specifically, the respective first ends 106 are aligned first end to first end, and the respective second ends 108 are aligned second end to second end. As the data tracks 104 are substantially the same length and lie parallel one to another, the respective second ends 106, 108 are also aligned within each physical group 202~216. The sections of material for receiving data (i.e., material 110) that lie between each respective first end 106 and second end 108 are also in parallel.

Symmetric selection of data tracks 104 within different physical groups 202~216 is advantageously ensured by this format of parallel structure and alignment of the data tracks 104 within each physical group 202~216, and the arrangement of the physical groups 202~216 themselves. For example, when a given read/write device 230 is aligned to the first end 106 of a given data track 232 in a given physical group 202, other read/write devices will similarly align to the first ends 106' of other data tracks 232' in other physical groups 204~216.

Stated another way, the read/write devices 220 track in parallel over a plurality of data tracks 104. The relative position of a specific read/write device 230 passing over a data track 232 is mirrored by other read/write devices 220 passing over other data tracks 104. Motion of the read/write devices 220 relative to the data medium 200 may be accomplished by physically moving the read/write devices 220 over the data medium 200, or by moving the data medium 200 beneath the read/write devices 220. Each read/write device 220 may be characterized as an active component, capable of actively performing an operation. In contrast, the data medium 200 may be characterized as a passive component, which receives an action—a write or a read.

As each read/write device 122 may require separate electrical connections, in at least one embodiment the control and selection of the read/write devices 122 is advantageously simplified by establishing the read/write devices 122 in a fixed medium, such as a silicon wafer. Located in a wafer proximate to, and parallel to, the data medium 200, relative motion can be achieved between the read/write devices 122 and the data tracks 104 by providing motion to the data medium 200.

For operational simplicity and configuration, in at least one embodiment the plurality of servo tracks 112 are grouped together and located in a single physical group, such as one cluster 118. With respect to FIG. 2, physical group 224 provides a plurality of servo tracks 112. Each servo track 112 provides tracking information for a logical group of data tracks 104 selected from multiple physical groups 202~216.

For example, servo track 112 provides tracking information for a logical group defined by the controller 126 consisting of data track 232 in group 202, data track 232' in group 208, and data track 232" in group 212. In at least one embodiment, each data track member of a logical group is selected from a different physical group 202~216.

FIG. 3 presents at least one embodiment of the data format preferably present on each data track 104. More specifically, FIG. 3 illustrates four data track members of a logical group. Due to the symmetric alignment properties of the parallel layout described above, the data tracks 300, 302, 304, and 306 may be easily viewed as parallel and aligned. The characteristics of each track 300~306 represented in FIG. 3 are understood to apply to all the data tracks 104 illustrated in FIGS. 1A~1E, 2, 4, and 5.

As shown for at least one embodiment, each data track 300~306 presents a synchronization section 308 adjacent to the first end 106. A track identification section 310 is adjacent to the synchronization section 308. A time padding section 312 is adjacent to the track identification section 310. At least one data section 314 is provided following the time padding section 312 and before the second end 108.

The track identification section 310 is provided to confirm correct selection of a data track 300~306 as a member of the logical group. The time padding section 312 is provided as a physical space permitting the continuation of horizontal motion between the data tracks 300~306 and read/write devices 122 while the controller 126 processes the identification information to confirm the proper track selection.

The size of each data section 314 may be adjusted; however each preferably provides storage for about between 9 to 12 bytes, with multiple data sections 314 providing 124 bytes per track. More specifically, in at least one embodiment a total of 12 data sections 314 may be written sequentially on each data track 300~306.

With respect to FIG. 3, the nature of logical groups, illustrated with dotted line 316 and 318, may be more fully appreciated. As discussed above, each data section 314 is physically present in a data track 104 and the data tracks 104 are allocated into physical groups. Members of logical group 316 are from at least two different physical groups. For example, and with respect to both FIGS. 2 and 3, data track 300 may correspond to the first data track of physical group 202, data track 302 may correspond to the first data track of physical group 204, data track 304 may correspond to the first data track of physical group 206, and data track 306 may correspond to the first data track of physical group 210.

When working with a logical group 316, the physical locations of the member data tracks is not of issue. Multiple logical groups may be represented with the same physical data tracks, i.e. a first logical group 316 may consist of data sections 314, and a second logical group 318 may consist of data sections 314'. The depiction in FIG. 3 of logical groups 316 and 318 as comprising 4 data tracks is for illustrative simplicity and is not intended to indicate that logical groups are intended to be limited to only four data track members. Moreover, FIG. 3 is intended as a logical view of the involved data tracks, and is not intended to suggest physical structure. Within the memory arts, a data sector is traditionally an allocation of 512 bytes. In at least one embodiment, each logical group 316, 318 provides 512 bytes, and may be considered a logical data sector.

In addition, in at least one embodiment the synchronization section 308 includes a bit level timing section. The synchronization section 308, track identification section 310 and time padding section 312 permit the system to confirm proper identification of each data track 300~306 within the logical group. This is accomplished during the relative horizontal motion and before data is written to or read from the data tracks 300~306.

Error Correcting Code (ECC) 322 may also be provided. For example, if a user provides 512 bytes of user data, 20 bytes of ECC code may be generated and attached to the user data to yield 532 bytes of data. These 532 bytes of data are then allocated across the data sections 314 which collectively provide the logical group 316. Moreover, a given data section 314 within a logical group 316 may contain user data, ECC, or a combination of both. ECC 322 is therefore shown within each data section 314 with a dotted diagonal line, indicating that each data section 314 may or may not contain data bits corresponding to the ECC code applicable to the provided user data. Preferably, ECC code is provided to advantageously assist with the recovery of data should corruption occur, a read/write device 122 fail, or other problem arise.

In at least one embodiment, the ECC 322 preferably is organized to provide correction for all involved data sections 314 of the logical group 316. In other words, the ECC 322 is provided to not only assist with the recovery of a specific lost or damaged data section 320, but also to provide assisted recover for the entire logical group 316, which may comprise a logical data sector.

As noted above, the servo track 112 provides tracking information. Specifically, the tracking information advantageously insures that the relative movement along the X axis 250 is substantially proper and maintained during the course of the relative motion. Such alignment is desired so that the intended data track members of the logical group are properly interacted with. The greater the precision of tracking control provided by the servo track 112, the closer the parallel data tracks 300~306 may be placed to each other. Precise tracking also permits closer spacing of the data sections 314 within each data track 300~306.

As stated above, the controller 126 establishes logical groups of data tracks corresponding to each servo track. With respect to FIG. 4, each physical group 202~216 (Group-1~Group-8) is shown as having a plurality of data tracks 104, numbered 1, 2, 3, . . . , n. Servo tracks 400, 402, and 440 are provided in physical group 224. Exemplary logical groups are established from data tracks 104 in the physical groups 202~216 as follows.

Logical Group #1 corresponds to servo track 400 having physical members identified to include:

Group-1, data track 1, data section 1 (G-1, T-1, S-1)
Group-2, data track 1, data section 1 (G-2, T-1, S-1)
Group-3, data track 1, data section 1 (G-3, T-1, S-1)
Group-4, data track 1, data section 1 (G-4, T-1, S-1)
Group-5, data track 1, data section 1 (G-5, T-1, S-1)

Likewise, Logical Group #2, corresponding to servo track 402 having physical members identified to include:

Group-2, data track 2, data section 2 (G-2, T-2, S-2)
Group-3, data track 2, data section 2 (G-3, T-2, S-2)
Group-4, data track 2, data section 2 (G-4, T-2, S-2)
Group-5, data track 2, data section 2 (G-5, T-2, S-2)
Group-6, data track 2, data section 2 (G-6, T-2, S-2)

In addition, Logical Group #3, corresponding to servo track 404 having physical members identified to include:

Group-3, data track 3, data section 2 (G-3, T-3, S-2)
Group-4, data track 3, data section 2 (G-4, T-3, S-2)
Group-5, data track 3, data section 2 (G-5, T-3, S-2)
Group-6, data track 3, data section 2 (G-6, T-3, S-2)
Group-7, data track 3, data section 2 (G-7, T-3, S-2)

Based upon these example logical groups, as shown in FIG. 4, user data "28088" is encoded to logical group #1. Specifically, data track 1, Group-1, 202, data section 1 receives a "2" as shown. Data track 1, Group-8, 204, data section 1 receives a "8" as shown, and so on. The following tables further illustrate the allocation of user data "52172" within logical group #2 and "20274" within logical group #3.

| Logical Group #1 | |
| --- | --- |
| Location | User Data |
| Group-1, data track 1, data section 1 (G-1, T-1, S-1) | 2 |
| Group-2, data track 1, data section 1 (G-2, T-1, S-1) | 8 |
| Group-3, data track 1, data section 1 (G-3, T-1, S-1) | 0 |
| Group-4, data track 1, data section 1 (G-4, T-1, S-1) | 8 |
| Group-5, data track 1, data section 1 (G-5, T-1, S-1) | 8 |

Logical Group #2

| Location | User Data |
|---|---|
| Group-2, data track 2, data section 2 (G-2, T-2, S-2) | 5 |
| Group-3, data track 2, data section 2 (G-3, T-2, S-2) | 2 |
| Group-4, data track 2, data section 2 (G-4, T-2, S-2) | 1 |
| Group-5, data track 2, data section 2 (G-5, T-2, S-2) | 7 |
| Group-6, data track 2, data section 2 (G-6, T-2, S-2) | 2 |

Logical Group #3

| Location | User Data |
|---|---|
| Group-3, data track 3, data section 2 (G-3, T-3, S-2) | 2 |
| Group-4, data track 3, data section 2 (G-4, T-3, S-2) | 0 |
| Group-5, data track 3, data section 2 (G-5, T-3, S-2) | 2 |
| Group-6, data track 3, data section 2 (G-6, T-3, S-2) | 7 |
| Group-7, data track 3, data section 2 (G-7, T-3, S-2) | 4 |

More specifically, the data is allocated in series across the logical group of data tracks 104 concurrently. Data track 1 of physical group 202 (Group-1) contains user data corresponding to Logical Group #1, first data element—in this example a "2". Physical group 206 (Group-2) contains data elements for all three above logical groups—data track 1="0" and data tracks 2 and 3="-,2", indicating the data element "2" in the section data section. More specifically, where a preceding data section is either empty or unknown a "-" is used.

The assignment of members to a logical group is preferably algorithmically based. For ease of discussion the member data track of a physical group coincides with the servo track, i.e. data tracks 1 match with servo track 1, data tracks 2 match with servo track 2 and data tracks 3 match with servo track 3. Under appropriate circumstances a more complex method of logical group assignment may be employed.

With respect to FIG. 4, the advantageous nature of the highly parallel data storage chip device 100 transferring data to different physical groups 202~216 so as to provide greater safeguard against corruption, loss of a read/write device 122 or other fault, may be further appreciated. While a single physical group 202~216 may become inadvertently damaged or loose a read/write device 220 without destroying the entire highly parallel data storage chip device 100, allocating user data into different physical groups 202~216 advantageously increases the likelihood that the majority of the user data will survive such a failure. By incorporating ECC 316 (see FIG. 3), the recovery of user data is further enhanced.

As the data tracks 104 of each logical group in the above example move past the read/write devices 122 in parallel, the highly parallel data storage chip device 100 advantageously permits the transfer of data between the data tracks 104 and the read/write devices 122 to occur as simultaneous parallel actions. To further assist with the parallel data transfer, in at least one embodiment highly parallel data storage chip device 100 further includes a memory buffer, buffering the simultaneous data transfer between the read/write devices 122 and the data tracks 104 of each logical group.

The speed of data transfer within the highly parallel data storage chip device 100 is based not solely on the speed of a read/write device 122, but rather on both the speed of the relative motion as well as the number of read/write devices 122 operating with the logical group of data tracks 104.

When processing a data stream that is tightly spaced, rapid movement over the data line to read or write the data generally requires complex electronics to process the data stream due to an decreased level of signal to noise. For example, the data element "1" may be represented by a specific signal peak, while the data element "0" may be represented by a different specific signal peak.

The channel processing the read bits is traditionally known as the "read channel." Processed at a slow pace, it is relatively easy to perceive the differences between the peak corresponding to a "1" and the peak corresponding to a "0". However, when processed quickly, the time duration between peaks is much shorter and the peaks may tend to "blur" together. As a result the read channel generally will require greater processing power applying complex logic processes to properly recognize and isolate the respective peaks from the apparent blur.

In contrast, in a slow and simple read channel, simple processes with reduced processing power may be employed. This permits the use of more simple electronics. Stated another way, a fast read channel operates at a higher frequency and thus requires more complex electronics and more power. A slow read channel operates at a lower frequency and thus may utilize simple electronics and less power. At least one embodiment of the present invention capitalizes on this slower read channel permitting more simplified electronics and a reduced need for power.

The reduced physical speed, reduced complexity of electronics and reduced power requirement does not imply that the highly parallel data storage chip device 100 is functionally slow. For example, if each data section 314 provides storage for 9 bytes, the allocation of 512 bytes may be spread across 57 data sections 314. Grouping all 57 data sections 314 within one logical group of data tracks 104, or within multiple sets of logical groups of data tracks 104 permits all 512 bytes to be transferred in a single pass across the physical distance of a single data section 314. The highly parallel data storage chip device 100 has an advantageous aggregate effect of enhanced speed without requiring additionally complex electronics or enhanced power as the operational speed is not solely based upon the read channel.

Generally speaking, greater precision may be had in devices moving slowly. Speed often requires greater power, greater precision in tooling and manufacturing, greater complexity of control systems, and greater structural integrity to limit factors such as vibration and sway. Reducing speed on the other hand, often permits a reduction in power supply, a greater flexibility in fabrication tolerance, simple control systems, and perhaps some reduction in structural integrity as vibration, sway and their effects are reduced.

The highly parallel data storage chip device 100 advantageously enjoys an effective speed for data transfer that is many times the actual physical speed provided by the mover 124 device without requiring or imposing the conditions and requirements generally associated with fast moving memory devices.

FIG. 5 conceptually illustrates a partial perspective view of the an embodiment of the highly parallel data storage chip device 100. It is appreciated that the size and scale of components has been exaggerated for the convenience of discussion.

A stator wafer 500 is provided in a first plane. The stator wafer 500 has a top surface 502 and a plurality of micromover devices 504 coupled to the top surface 502. A mover wafer 506 is also provided in a second plane parallel to the first plane. The mover wafer 506 is proximate to and aligned with the top surface 502 of the stator wafer 500, as illustrated by dotted lines 514.

At least one portion 508 of the mover wafer 506 is moved along an X axis 250 and a Y axis 252 by the micromover device 504. The moving portion 508 provides the foundation for a plurality of parallel data tracks 104 as described above. The data tracks 104 are the same length and allocated into separate physical groups 202~216 upon the moving portion 508. At least one servo track 112 as described above is also provided parallel to the data tracks 104. In at least one embodiment, the servo tracks 112 are located in physical group 224.

A read/write wafer 510 is provided in a third plane parallel to the second plane. The read/write wafer 510 is proximate to and aligned with the mover wafer 506, opposite from the stator wafer 500. The read/write wafer 510 provides a plurality of read/write devices 122 parallel to the Y axis 252 and aligned with each moving portion 508. A controller 126 such as that described above is coupled to the stator wafer 500, and electrically coupled to each micromover device 504, as illustrated by dotted lines 512. The controller 126 directs the operation of the micromover device 504 and the operation of the read/write devices 220.

Each wafer 500, 506 and 510 is an appropriate semiconductor wafer, as may be fabricated by photolithographic processes, ion-milling, or other appropriate micro-electronic semi-conductor fabrication processes. Shown for the sake of discussion in exploded form, the stator wafer 500 is physically bonded to the mover wafer 506 which in turn is physically bonded to the read/write wafer 510 to create a highly parallel data storage chip device 100 for suitable use in devices such as portable music players, cameras, digital video recorders, portable storage devices, or other systems.

Changes may be made in the above methods, systems and structures without departing from the scope thereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

We claim:

1. A highly parallel data storage chip device comprising:
   a data storage medium providing foundation for a plurality of parallel data tracks having the same length, each presenting a first and second end and a material for receiving data therebewteen, the plurality of data tracks, when established, allocated into separate physical groups;
   at least one servo track parallel to the data tracks and presenting tracking information for a logical group of data tracks selected from multiple physical groups;
   a plurality of read/write devices proximate to the data storage medium and aligned transverse to the servo track;
   movers configured to provide relative horizontal motion between the plurality of read/write devices and the data storage medium;
   a controller capable of establishing the logical group corresponding to the servo track and operating the mover over a pathway including the servo track;
   the controller being operable during a data transfer operation to align a read/write device with a servo track and align a subset of read/write devices to the logical group of data tracks corresponding to the tracking information, the controller further directing simultaneous data transfer between the subset of read/write devices and the logical group of data tracks concurrent with relative motion.

2. The highly parallel data storage chip device of claim 1, wherein the plurality of data tracks are established during fabrication of the device.

3. The highly parallel data storage chip device of claim 1, wherein each physical group contains a plurality of data tracks.

4. The highly parallel data storage chip device of claim 1, wherein the controller is further capable of operating the mover over a pathway parallel to the servo track to define, by action of the plurality of read/write devices on the data storage media, the plurality of parallel data tracks.

5. The highly parallel data storage chip device of claim 1, wherein each data track of the logical group is selected from a different physical group.

6. The highly parallel data storage chip device of claim 1, further including a memory buffer, in operation the device buffering the simultaneous data transfer between the read/write devices and the logical group.

7. The highly parallel data storage chip device of claim 1, wherein each data track further includes:
   a synchronization section adjacent to the first end;
   a track identification section adjacent to the synchronization section;
   a time padding section adjacent to the track identification section; and
   at least one data section following the time padding section and before the second end.

8. The highly parallel data storage chip device of claim 7, wherein the synchronization section includes a bit level timing section.

9. The highly parallel data storage chip device of claim 7, wherein each data section may further includes an error correction code (ECC) sub-section.

10. A highly parallel data storage chip device comprising:
    a data storage medium providing a plurality of parallel data tracks having the same length, the plurality of data tracks allocated into separate physical groups, each data track presenting a first and second end and a material for receiving data therebewteen, each data track structured and arranged to provide:
    a synchronization section adjacent to the first end;
    a track identification section adjacent to the synchronization section;
    a time padding section adjacent to the track identification section; and
    at least one data section following the time padding section and before the second end;
    at least one servo track parallel to the data tracks and presenting tracking information for a logical group of data tracks selected from different physical groups;
    a plurality of read/write devices proximate to the data storage medium and aligned transverse to the servo track and data tracks;
    a mover configured to provide relative horizontal motion between the plurality of read/write devices and the data storage medium;
    a controller capable of establishing the logical group corresponding to the servo track and operating the mover over a pathway including the servo track.

11. The highly parallel data storage chip device of claim 10, the controller being operable during a data transfer operation to align a read/write device with a servo track and align a subset of read/write devices to the logical group of data tracks corresponding to the tracking information, the controller further directing simultaneous data transfer between the subset of read/write devices and the logical group of data tracks concurrent with relative motion.

12. The highly parallel data storage chip device of claim 11, wherein the controller is further capable of operating the mover over a pathway parallel to the servo track to define, by action of the plurality of read/write devices on the data storage media, the plurality of parallel data tracks.

13. The highly parallel data storage chip device of claim 10, wherein the plurality of data tracks are established during fabrication of the device.

14. The highly parallel data storage chip device of claim 10, wherein each data track of the logical group is selected from a different physical group.

15. The highly parallel data storage chip device of claim 10, wherein the synchronization section includes a bit level timing section.

16. The highly parallel data storage chip device of claim 10, wherein the number of read/write devices is equal to or less than the number of data tracks plus the servo track.

17. The highly parallel data storage chip device of claim 10, wherein each physical group contains the same number of data tracks, each physical group having at least two data tracks.

18. The highly parallel data storage chip device of claim 10, wherein each data section may further includes an error correction code (ECC) sub-section.

19. The highly parallel data storage chip device of claim 18, wherein the ECC is applicable to the entire logical group containing the data section.

20. The highly parallel data storage chip device of claim 10, wherein user data is allocated in series across the logical group of data tracks concurrently.

21. The highly parallel data storage chip device of claim 10, wherein each data section provides storage for about between 9 to 12 bytes.

22. The highly parallel data storage chip device of claim 10, wherein fifteen data tracks comprise a logical group of data tracks identified by the controller.

23. A highly parallel data storage chip device comprising:
a stator wafer in a first plane, the stator wafer having a top surface and at least one mover device coupled to the top surface;
a mover wafer in a second plane parallel to the first plane, the mover wafer proximate to and aligned with the top of the stator wafer, at least one moving portion of the mover wafer moved along an X axis and a Y axis within the second plane by a mover device, the moving portion providing a data storage medium providing foundation for a plurality of parallel data tracks of the same length, the plurality of data tracks allocated into separate physical groups, the moving portion further providing at least one servo track parallel to the data tacks and presenting tracking information for a logical group of data tracks selected from different physical groups; and
a read/write wafer in a third plane parallel to the second plane, the read/write wafer proximate to and aligned with the mover wafer, opposite from the stator wafer, the read/write wafer having a plurality of read/write devices parallel to the Y axis and aligned with each at least one moving portion.

24. The highly parallel data storage chip device of claim 23, further including a controller capable of operating the mover device over a pathway including the servo track.

25. The highly parallel data storage chip device of claim 24, the controller being operable during a data transfer operation to align a read/write device with a servo track and align a subset of read/write devices to the logical group of data tracks corresponding to the tracking information, the controller further directing simultaneous data transfer between the subset of read/write devices and the logical group of data tracks concurrent with relative motion.

26. The highly parallel data storage chip device of claim 24, wherein the plurality of data tracks are established during fabrication of the device.

27. The highly parallel data storage chip device of claim 24, wherein the controller is further capable of operating the mover over a pathway parallel to the servo track to define, by action of the plurality of read/write devices on the data storage media the plurality of parallel data tracks.

28. The highly parallel data storage chip device of claim 24, wherein the mover device is an electrostatic motor.

29. The highly parallel data storage chip device of claim 24, wherein each mover device provides 16 identical moving portions, each moving portion providing 16 data clusters, each data cluster providing 112 patches, each patch providing 1000 parallel data tracks of the same length.

30. The highly parallel data storage chip device of claim 29, wherein all servo tracks are located in one data cluster.

31. The highly parallel data storage chip device of claim 24, wherein each data track presents a first end and a second end and;
a synchronization section at a first end of the data track;
a track identification section adjacent to the synchronization section;
a time padding section adjacent to the track identification section; and
at least one data section following the time padding section and before a second end of the data track.

32. The highly parallel data storage chip device of claim 31, wherein the synchronization section includes a bit level timing section.

33. The highly parallel data storage chip device of claim 31, wherein each data section may further includes an error correction code (ECC) sub-section.

* * * * *

UNITED STATES PATENT AND TRADEMARK OFFICE
CERTIFICATE OF CORRECTION

PATENT NO. : 7,171,512 B2
APPLICATION NO. : 10/848392
DATED : January 30, 2007
INVENTOR(S) : Tracy Sauerwein et al.

Page 1 of 1

It is certified that error appears in the above-identified patent and that said Letters Patent is hereby corrected as shown below:

On the Title page, in Item (75), in "Inventors" delete "Richard Hilton" and insert -- Richard L. Hilton --, therefor.

In column 11, line 51, in Claim 1, delete "therebewteen," and insert -- therebetween, --, therefor.

In column 12, line 45, in Claim 10, delete "therebewteen," and insert -- therebetween, --, therefor.

Signed and Sealed this

Twenty-seventh Day of October, 2009

David J. Kappos
*Director of the United States Patent and Trademark Office*